(12) United States Patent
Yamasaki et al.

(10) Patent No.: US 6,224,703 B1
(45) Date of Patent: May 1, 2001

(54) METHOD OF MAKING LAMINATE CERAMIC SUBSTRATE WITH DOMED PADS

(75) Inventors: Kozo Yamasaki, Gifu; Hideshi Matsubara, Nagoya; Kazuo Kimura, Aichi; Motohiko Itai, Gifu, all of (JP)

(73) Assignee: NGK Spark Plug Co., Ltd., Nagoya (JP)

( * ) Notice: Subject to any disclaimer, the term of this patent is extended or adjusted under 35 U.S.C. 154(b) by 0 days.

(21) Appl. No.: 09/226,119

(22) Filed: Jan. 7, 1999

(30) Foreign Application Priority Data

Jan. 8, 1998 (JP) .................................................. 10-002662
Dec. 2, 1998 (JP) .................................................. 10-343089

(51) Int. Cl.$^7$ .......................... B32B 31/12; B32B 31/26; B05D 5/12
(52) U.S. Cl. ...................... 156/89.16; 264/614; 427/96; 427/97
(58) Field of Search .................... 156/89.16, 249, 156/89.12; 264/614, 618, 619; 427/96, 97; 29/851

(56) References Cited

U.S. PATENT DOCUMENTS

| | | | |
|---|---|---|---|
| 5,174,201 | * | 12/1992 | Andris et al. . |
| 5,332,439 | * | 7/1994 | Watanabe et al. . |
| 5,578,151 | * | 11/1996 | Andris et al. ........................ 427/97 X |
| 5,635,000 | * | 6/1997 | Casey et al. ........................ 156/249 X |
| 5,759,669 | * | 6/1998 | Casey et al. ................... 156/89.12 X |
| 5,792,293 | * | 8/1998 | Inasaka .............................. 156/89.16 |
| 5,927,193 | * | 7/1999 | Balz et al. . |
| 6,045,714 | * | 4/2000 | Humenik et al. . |

FOREIGN PATENT DOCUMENTS

| | | |
|---|---|---|
| 3-112191 | 5/1991 | (JP) . |
| 9-223721 | 8/1997 | (JP) . |
| 10-41626 | 2/1998 | (JP) . |

* cited by examiner

*Primary Examiner*—Curtis Mayes
(74) *Attorney, Agent, or Firm*—Foley & Lardner

(57) ABSTRACT

A method of making a laminate ceramic substrate with domed pads is provided. In the method, a ceramic green sheet is prepared which has a pair of first and second opposite main surfaces and a plurality of through holes extending between the first and second main surfaces. The ceramic green sheet is placed upon a flat elastic sheet in such a manner that the first main surface of the ceramic green sheet is in contact with the flat elastic sheet. Metallizing ink is filled into the through hole so that a portion of the ink protrudes beyond the first main surface to form domed protruded portions by elastic deformation of the elastic sheet. The green sheet (optionally placed upon at least one other green sheet in such a manner that the second main surface is in contact with the other green sheet) is then sintered, thereby forming the domed, protruded portions of the metallizing ink into domed pads.

18 Claims, 12 Drawing Sheets

METHOD OF MAKING LAMINATE CERAMIC SUBSTRATE WITH DOMED PADS

BACKGROUND OF THE INVENTION

1. Field of the Invention

The present invention relates to a method of making a laminate ceramic substrate having pads for connection with bumps of an electronic part, particularly of the kind in which all of or part of the pads have a domed shape.

2. Description of Related Art

A technique of making a laminate ceramic substrate by filling metallizing ink in through holes for vias (hereinafter will be referred to as "via holes") which are formed in ceramic green sheets at predetermined positions thereof and/or printing predetermined circuit patterns on the surface of the ceramic green sheets with metallizing ink, laminating a plurality of such green sheets in a predetermined order, and sintering the laminated green sheets, is known. With a recent demand for miniaturization and high density integration, a flip-chip technology is used as a technique for mounting and connecting an electronic part such as an IC (integrated circuit) chip to such a laminate ceramic substrate (hereinafter will be referred to simply as "substrate"). By the flip-chip technology, bumps are previously formed on the connecting ends of the electronic part while pads are formed on the substrate at corresponding positions to the bumps, and the bumps and pads are connected to each other.

There is also known such a modified kind of flip-chip technology wherein pads are formed on the mounting surface of a substrate on which an electronic part is mounted, nearly spherical or semispherical solder bumps are formed on an electronic part, and the pads and the solder bumps are subjected to heating while being held in contact with each other such that the solder bumps are melted to cause the pads and solder bumps to be connected to each other. This technology has an advantage in that it can dispense with the use of a metallic ball and therefore electronic devices can be produced at a lower cost as compared with the technology using metallic balls such that metallic balls are fixed by soldering to form metallic ball bumps which are then connected to pads by another soldering.

However, it was found that when the electronic part and substrate were connected in the above described manner, the solder bumps had a possibility of being reduced in the connecting strength. The connection of the electronic part to the substrate by means of the solder bumps can be tested for connecting strength by peeling off the substrate from the electronic part (this test is also referred to as "tensile breaking test"). When the connection is good, the soft solder (i.e., solder bump) is elongated in such a manner as to become narrower or thinner at a central portion thereof and then broken while allowing the solder having a nearly conical shape to be left behind on both of the electronic part side and the substrate side. By this test, it was found that some of the connected structures attained in the above described manner caused a fracture adjacent the substrate whose fractured surface had fine irregularities. The connected structured that causes such a fractured surface is easily broken in practical use and therefore low in reliability. This is because small voids (air holes) were included in the solder bumps after connection. It is believed that air and flux were enclosed in the space between the pad and the solder bump so that such air and cracked gas resulting from the heated flux were involved in the melted solder bump (i.e., solder) to cause such voids.

From further investigation, it was revealed that the surface of the pad in the form of a flat plate had small irregularities so that the junction between the pad and the solder bump was not attained substantially at one point but at a plurality of points or surfaces, and when the solder bump was heated, the solder bump started melting at the junction between the solder bump and the pad prior to the melting of the rest of the solder, and as such, the melted portion of the solder bump developed from the junction between the solder and the pad.

In contrast to this, when the pad is entirely or partly formed into a domed shape so as to contact the solder bump at one point, the solder of the solder bump starts melting at the point where it contacts the pad, when it melts, and wets and spreads over the pad. Due to this, the solder spreads out while expelling air and flux from the interface between the solder and the pad, so that air and cracked gas of flux do not become enclosed inside the solder to cause voids therewithin. Accordingly, a good result was obtained when the soldered assembly prepared in this way was subjected to the tensile breaking test. Further, since the electronic part and the substrate are connected so firmly, the connection therebetween can be highly reliable.

On the other hand, in view of existing circumstances in which the via holes are becoming smaller in diameter and becoming larger in number and with a view to providing a bonding pad having a good strength, Japanese patent provisional publication No. 3-112191 discloses a wired ceramic substrate with bonding pads each formed from a protruded end portion of a conductor layer or a via protruding from the via hole. Further, this document also discloses a method of forming such a bonding pad, as follows. That is, two kinds of conductive pastes having different coefficients of sintering contraction are prepared. One of the conductive paste having a larger difference in the coefficient of sintering contraction with respect to the green sheet (i.e., the conductive paste having a smaller coefficient of contraction) is filled under pressure into the via holes of the uppermost green sheet. On the other hand, the other of the conductive pastes having a smaller difference in coefficient of sintering contraction is filled into the via holes of other green sheets. Thereafter, those green sheets are placed one upon another and sintered at one time such that the conductive layers (i.e., vias) are caused to partially protrude from the via holes of the uppermost layer to form bonding pads.

However, in this technique, only the difference in the coefficient of contraction between the metallizing ink for via and the ceramic green sheet is used for the vias to protrude. Thus, when the difference of the coefficient of contraction is made larger to increase the amount of protrusion, radial cracks form in the ceramic layers around the vias into which the plating solutions intrude and remain, thus causing the drawback of reduced insulation resistance.

Further, a method usually used for filling of the ink under pressure is as follows. That is, as shown in FIG. 13A, on a rigid jig UH in the form of a flat plate such as a metal plate is placed a ceramic green sheet G having via holes H and on which is further placed a metal mask M having through holes MH at corresponding positions to the via holes H. Then, as shown in FIG. 13B, metallizing ink for via is forcedly filled by means of a squeegee or the like into the via holes H through the through holes MH of the metal mask M.

However, by this technique, frequently the end surface INa of the filled ink IN in contact with the jig UH in the form of a planar plate is not always formed flat or planar. For example, a portion of the end surface (e.g., a central portion) can be lower in level than the surrounding area, i.e., it can become depressed or irregularities as wrinkles or furrows can be caused in the end surface. While nothing definite is known about the cause for such depression or irregularities, it is believed that since the metallizing ink IN which is high in viscosity and therefore poor in filling ability is filled into the via holes H under pressure and the via holes H are closed at one end (i.e., the lower ends in the drawing) by the hard jig UH in the form of a flat plate, the filled ink IN has difficulty in forming a flat surface after the shape of the jig UH in the form of a flat plate, at the end of the via hole H. If the sheets G filled with ink IN having such end surfaces INa are laminated and sintered at the same time to form a substrate CS in which the vias MT are caused to protrude from the mounting surface Csa, due to the difference of the coefficient of sintering contraction, the protruded end MTa of each via MT, as shown in FIG. 13C, is not formed into such a domed shape that enables the protruded end to contact the solder bump at one point with as described above. Thus, the vias MT with such an end surface MTa may possibly cause voids in the solder bumps after connection of the vias MT to the solder bumps, thereby lowering their connecting strength and therefore the reliability of the connection.

In the meantime, a technique is also known in which after filling the metallizing ink for via, cover layers are printed onto the sheet in such a way as to cover the end surfaces of the filled masses of metallizing ink and then sintered to be used as pads.

Such a technique requires an additional printing process for cover layers and therefore increases the number of processes. Furthermore, due to the limits of improvement in the printing accuracy, there is difficulty in using such pads as those for fine pitch connection.

SUMMARY OF THE INVENTION

In accordance with the present invention, there is provided, a method of making a ceramic substrate with domed pads comprising: (i) preparing a ceramic green sheet having a pair of first and second opposite main surfaces and a plurality of through holes extending between the first and second main surfaces; (ii) placing the ceramic green sheet upon a flat elastic sheet so that the first main surface of the ceramic green sheet is in contact with the flat elastic sheet; (iii) filling metallizing ink into the through holes so that a portion of the metallizing ink protrudes beyond the first main surface to form domed protruded portions by elastic deformation of the elastic sheet; and (iv) sintering the green sheet for thereby forming the domed, protruded portions of the netallizing ink into domed pads.

In further accordance with the present invention, there is provided a method of making a laminate ceramic substrate with domed pads comprising: (i) preparing a ceramic green sheet having a pair of first and second opposite main surfaces and a plurality of through holes extending between the first and second main surfaces; (ii) placing the ceramic green sheet upon a flat elastic sheet so that the first main surface of the ceramic green sheet is in contact with the flat elastic sheet; (iii) filling metallizing ink into the through holes and so that a portion of the metallizing ink protrudes beyond the first main surface to form domed protruded portions by elastic deformation of the elastic sheet; and (iv) placing the green sheet upon at least one further green sheet so that the second main surface is in contact with the further green sheet and sintering the green sheets, thereby forming the domed, protruded portions of the metallizing ink into domed pads.

In yet further accordance with the present invention, there is provided a method of making a ceramic substrate with domed, protruded portions of vias protruding from a mounting surface of the substrate, comprising: (i) placing a ceramic green sheet for forming the mounting surface, which has a first main surface and second main surface and through holes for vias extending between the first and second main surfaces, upon a flat elastic surface which is elastically deformable such that the flat elastic surface becomes depressed at a portion where the elastic surface is pushed; (ii) filling metallizing ink for vias into the through holes from a side of the second main surface of the ceramic green sheet, such that a portion of the metallizing ink protrudes beyond the first main surface toward the flat elastic surface to form domed protruded portions; and (iii) sintering the green sheet.

In still yet further accordance with the present invention there is provided a method of making a laminate ceramic substrate with domed, protruded portions of vias protruding from a mounting surface of the substrate, comprising: (i) placing a ceramic green sheet for forming the mounting surface, which has a first main surface and second main surface and through holes for vias extending between the first and second main surfaces, upon a flat elastic surface which is elastically deformable such that the flat elastic surface becomes depressed at a portion where the flat elastic surface is pushed; (ii) filling metallizing ink for vias into the through holes from a side of the second main surface of the ceramic green sheet such that a portion of the metallizing ink protrudes beyond the first main surface toward the flat elastic surface to form domed, protruded portions; (iii) laminating the ceramic green sheet and at least one further ceramic green sheet in such a manner that the first main surface of the green sheet forming the mounting surface is exposed to the outside at least at an area where the domed protruded portions of the metallizing ink are located; and (iv) sintering the green sheets.

The present invention further provides ceramic substrates with domed pads as well as laminate ceramic substrates with domed pads.

Additional objects, features and advantages of the invention will be set forth in the description which follows, and in part will be obvious from the description, or may be learned by practice of the invention. The objects, features and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and, together with the general description given above and the detailed description of the preferred embodiment given below, serve to explain the principles of the invention.

FIGS. 1A and 1B are illustrations of a method of making a substrate according to the first embodiment of the present invention, wherein FIG. 1A illustrates a step of placing a mounting surface green sheet upon a flat elastic rubber surface and FIG. 1B illustrates a step of filling metallizing ink into via holes;

FIGS. 2A and 2B are illustrations of a method of making a substrate according to the first embodiment, wherein FIG. 2A is a cross sectional view of a green sheet having been filled with metallizing ink by an ink filling step of FIG. 1B, and FIG. 2B is an enlarged view of a portion "A" of FIG. 2A;

3A is a sectional view of green sheets to be laminated, FIG. 3B is a sectional view of a laminate ceramic substrate after sintering, and FIG. 3C is an enlarged view of a portion "B" of FIG. 3B and shows a pad and its surrounding;

FIGS. 10A and 10B are illustrations of a drawback resulting when a rubber sheet U2 is too soft, wherein FIG. 10A illustrates deformation of a rubber sheet, green sheet and metal mask at the time of filling of ink using a squeegee, and FIG. 10B illustrates the shape of a protruded portion of the filled ink;

FIGS. 11A to 11C are illustrations of a method of making a substrate according to the second embodiment, wherein FIG. 11A illustrates a sheet mounting jig which is used in place of the rubber sheet U2 of FIG. 10A, FIG. 11B illustrates a step of placing a mounting surface green sheet, and FIG. 11C illustrates a step of filling ink;

FIGS. 12A to 12C are illustrations of a method of making a substrate according to the second embodiment, wherein FIG. 12A is an enlarged sectional view of a protruded portion and its surrounding of a green sheet having been filled with ink at the ink filling process of FIG. 11C, FIG. 12B illustrates sheets to be laminated, and FIG. 12C is a sectional view of a laminate ceramic substrate after sintering; and FIGS. 13A to 13C are illustrations of a prior art method of making a substrate, wherein FIG. 13A illustrates a step of placing a mounting surface green sheet on a jig, FIG. 12B illustrates a step of filling ink in via holes and FIG. 12C is an enlarged fragmentary sectional view of a pad and its surrounding after sintering.

DETAILED DESCRIPTION OF THE PREFERRED EMBODIMENTS

Figure 1A:
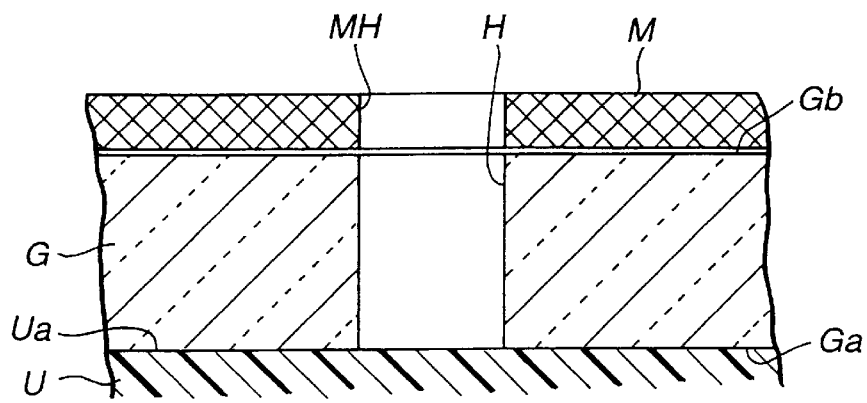

According to an aspect of the present invention, there is provided a method of making a laminate ceramic substrate with domed, protruded portions of vias protruding from a mounting surface of the substrate. The method comprises the steps of placing a ceramic green sheet for forming the mounting surface, which has a first main surface and second main surface and via holes extending between the first and second main surfaces, upon a flat elastic surface which is elastically deformable so as to be depressed at a place where it is pushed, filling metallizing ink for via under pressure, into the through holes from a side of the second main surface of the ceramic green sheet and protruding part of the metallizing ink beyond the first main surface toward the flat elastic surface to form domed, protruded potions, and laminating the ceramic green sheet and another ceramic green sheet in such a manner that the first main surface is exposed to the outside at least at an area where the protruded portions of the metallizing ink are located and sintering the green sheets. Suitable metallizing inks for use in connection with the present invention include those disclosed, for example in U.S. Pat. No. 5,060,049 and U.S. Pat. No. 5,093,186, both assigned to NGK Spark Plug Co., Ltd., and incorporated herein in their entireties by reference.

According to the present invention, at the step of filling and protruding, the metallizing ink for via can be made to protrude from the first main surface, thus making it possible to form the pads protruding from the mounting surface assuredly. Further, at the step of filling and protruding, the metallizing ink for via can be filled into the through holes while holding the green sheet upon the elastic surface, so the elastic surface is depressed by the pushing force of the ink at the time of filling, thus enabling part of the metallizing ink to protrude and be formed into a desired domed shape which is highest at or adjacent its center, i.e., at or adjacent the center axis of each through hole. This is because the elastic surface is elastically deformable to become depressed by the pushing force and the metallizing ink at the time of filling is deformable after the shape of the elastic surface so that the protruded portion of the metallizing ink is formed into a domed shape substantially without any irregularity or even without any irregularity at all at the surface thereof. Accordingly, it becomes possible to manufacture, after sintering, a substrate with vias having protruded portions formed into such a domed shape that is highest at or adjacent the center thereof. Thus, by using the protruded portions of the vias as pads or using the protruded portions of the vias which are plated with any suitable material, e.g., Ni-plated, as pads, and connecting the pads to solder bumps of an IC chip or the like, the substrate and the IC chip can be connected without causing any voids in the solder bumps and therefore with a high reliability. Further, the pads are nearly of the same diameter with the vias and therefore can be smaller in size and can be arranged more closely or densely as compared with those formed on the mounting surface by printing. In particular, the via diameters can suitably range from about 75 μm to about 200 μm, or from 75 μm to 200 μm, while the pad diameters can suitably range from 75 μm to about 240 μm, or from 75 μm to 240 μm.

In the meantime, the ceramic substrate can be formed with not only the vias but wiring conductors between adjacent two ceramic layers. Further, as the ceramic for forming the substrate can be used a known material such as alumina, aluminum nitride, mullite and glass ceramic. Further, the metallizing ink for via, i.e., the material of vias can be determined in relation to the ceramic material used for forming the substrate and can be selected, for example, from tungsten, molybdenum, molybdenum-manganese, copper, silver, silver-platinum, silver-palladium, etc. Further, in order to improve the soldability of the protruded portions of the vias formed by the step of sintering, the protruded portions may be provided with one or more kinds of any suitable types of plated coatings, for example, may be Ni-plated and thereafter Au-plated.

According to a further aspect of the present invention, the filling of the metallizing ink is performed so that the height of the protruded portions of the metallizing ink above the first main surface is in the range from 1 to 10 μm. When the height of the protruded portions is so small, i.e., less than 1 μm, filling of the ink may be difficult to be improved as desired but the irregularities of the surface of the protruded portion of each via may be present in a manner similar to the prior art. On the other hand, when the height of the protruded portions exceeds beyond 10 μm, there may arise a difficulty in equalizing the heights of the protruded portions of the vias which are formed at the same time, thus possibly reducing the coplanarity and therefore possibly deteriorating the property of connection between the solder bumps of an IC chip or the like and the pads formed by the protruded portions of the vias.

In the meantime, as a technique for controlling the height of the protruded portions can be enumerated a technique for controlling the pressure applied to the metallizing ink at the time of filling and a technique for changing the softness of the flat elastic surface. The metallizing ink can be forcedly filled into the through holes under pressure if desired according to some aspects of the present invention. Suitable pressures for the filling operation in connection with the present invention can range, for example, from about 4.5 to about 7 Kg/cm$^2$ or from 4.5 to 7 Kg/cm$^2$.

According to a further aspect of the present invention, the coefficient of sintering contraction of the metallizing ink is smaller than that of the ceramic green sheet for forming the mounting surface (herein after will be referred to as "mounting surface green sheet"). By this, since the coefficient of sintering contraction of the metallizing ink for via is set smaller than that of the mounting surface green sheet, the mounting surface green sheet contracts more at the time of sintering of the laminated green sheets to cause the metallizing ink for via to protrude toward the first main surface (i.e., mounting surface) side due to the difference in coefficient of sintering contraction therebetween. Thus, the height of this protrusion is added to the height of the domed protruded portion of ink formed previously, thereby making it possible to further increase the height of the protruded portions of the vias. On the contrary, in case the coefficient of sintering contraction of the metallizing ink is set larger than that of the mounting surface green sheet, the ink having been filled so as to protrude from the first main surface is caused to deform in such a way as to reduce the height of protrusion, so it is desired that the coefficient of sintering contraction of the metallizing ink for via is equal to or smaller than that of the mounting surface green sheet.

According to a further aspect of the present invention, the difference in height between each of the protruded portions of the metallizing ink and each of the pads which the protruded portions of the metallizing ink are formed into after sintering, is selected so as to be 5 μm or less.

The smaller the coefficient of sintering contraction of the metallizing ink becomes than that of the ceramic green sheet for forming the mounting surface, the larger the increase of height of the protruded portions of the vias due to the difference in the coefficient of contraction becomes. However, if the difference in the coefficient of sintering contraction between them is set too large, the stress caused between the vias and the ceramic surrounding due to the difference of the coefficient of sintering contraction may become too large, thus causing radial cracks in the ceramic substrate portions around the vias and causing, in the worst case, such cracks connecting between vias. Due to this, there occurs such a drawback that plating solutions remain in the cracks, thus lowering the insulation resistance. Accordingly, it is generally not desirable to make the difference of the coefficient of sintering contraction too large. In particular, it is preferred according to some aspects of the invention that the coefficient of sintering contraction of the ink be nearly the same as that of the green sheet and be about 20% or exactly 20%.

According to the present invention, the difference in height of protrusion between the metallizing ink protruded at the step of filling and the pads formed at the step of sintering is preferably set to be 5 μm or less, i.e., increase in the height of protrusion of the vias due to the difference of the coefficient of sintering contraction is determined so as to be 5 μm or less. By this, an effect of increase in the height of protrusion due to the difference in the coefficient of sintering contraction is attained while preventing the difference of the coefficient of sintering contraction from becoming too large.

According to a further aspect of the present invention, the at least one further ceramic green sheet is employed and the further green sheet is made of the same material as the mounting surface green sheet and has through holes for vias, and the metallizing ink for via is also filled into the through holes of the other ceramic green sheet. The metallizing ink used in the method of the present invention has a suitably small coefficient of sintering contraction than that of the mounting surface green sheet, so a drawback due to the difference of the coefficient of sintering contraction is never caused. Accordingly, in case the same material, i.e., the material of the same coefficient of sintering contraction as the surface mounting green sheet is used for forming the other green sheet to be placed upon the surface mounting green sheet, the metallizing ink used for the surface mounting green sheet can be used for the through holes for via formed in the other green sheet. Thus, by using the common materials for the green sheet and the metallizing ink for via (i.e., one kind of material for each) for forming the substrate, it becomes unnecessary to prepare a plurality of kinds of ink, etc. and the manufacturing process can also be common, thus making it possible to manufacture the substrate at low cost.

According to a further aspect of the present invention, the flat elastic surface is a surface of an elastic rubber layer that covers a surface of a hard base member for mounting thereon the ceramic green sheet. The elastic rubber layer can be all or part of an elastic sheet. Suitable elastic sheets may comprise any suitable material such as 2 parts of a hardenable liquid silicon rubber (such as KE-4895 sold by Shinetsu Silicon Co., Ltd.) and 1 part alumina paste (i.e., 95% Al$_2$O$_3$ and 5% CaO, MgO, SiO$_2$). The major component of the alumina paste is preferably the same material as at least one of the ceramic green sheets used.

When the metallizing ink for via is filled into the through holes, the flat elastic surface is pushed by the ink and caused to become depressed, thus allowing the metallizing ink to be filled so as to protrude beyond the first main surface. In this instance, when the flat elastic surface is so soft as to become depressed excessively, the ink is caused to spread in the direction intersecting the axes of the through holes at right angles (i.e., along the first main surface). Due to this, the distance between the masses of ink for the adjacent two through holes becomes smaller, thus reducing the insulation resistance between the vias of the substrate after sintering to cause, in the worst case, a short circuit. Further, if a squeegee is used for filling the metallizing ink into the through holes, there is a possibility that a pushing force of the squeegee is applied to the entire green sheet and causes the flat elastic surface to deform largely together with the green sheet. Such deformation of the green sheet is undesirable since it can cause a wrinkle or wrinkles. According to this feature of the invention, the flat elastic surface is the surface of an elastic rubber layer that covers a green sheet mounting surface side of a hard base member. By this, the pushing force applied to the entire green sheet such as the pushing force of a squeegee, for example, can be supported by the base member, so the deformation of the green sheet of itself can be limited. On the other hand, when the ink is filled into the through holes for vias, the flat elastic rubber surface which is the surface of the elastic rubber layer becomes depressed suitably by being pushed by the ink, so that it becomes possible to protrude part of the ink from the first main surface and allow it to be formed into a domed shape of a desired height of protrusion, while substantially or completely preventing the ink from spreading along the first main surface. Further, it becomes possible to protrude the ink from the main surface assuredly without causing a drawback such as wrinkles of the green sheet itself during the step of filling and protruding.

The above described method is effective for solving the above noted problem inherent in the prior art method.

It is accordingly an object of the present invention to provide a method of making a laminate ceramic substrate with domed pads, which can assuredly form the pads into a desired domed shape.

FIRST EMBODIMENT

Referring now to the drawings, a method of making a laminate ceramic substrate according to the first embodiment of the present invention will be described. A substrate to be produced by the method of this invention is generally indicated by 10 in FIGS. 4 to 7. The substrate 10 is produced by first preparing an incomplete substrate 1 having been sintered but not yet plated and then applying a Ni-plated coating and a Au-plated layer to the incomplete substrate 1. The incomplete (i.e., not yet plated) substrate 1 (refer to FIG. 3B) can be produced, for example, by preparing an alumina ceramic green sheet G including a ceramic component, suitably 92% of which is alumina, forming in the green sheet G such portions that serve as conductor passages which are so-called vias and pads (protruded portions of the vias) by using any conventional metallizing paste or ink for via including but not limited to tungsten and molybdenum as major constituents, and thereafter laminating the green sheet G and other green sheets G2, G3 and sintering them all at once. Suitable metallizing inks for use in connection with the present invention include those disclosed, for example in U.S. Pat. No. 5,060,049 and U.S. Pat. No. 5,093,186, both assigned to NGK Spark Plug Co., Ltd., and incorporated herein in their entireties by reference.

As shown in FIG. 1A, a green sheet G formed with via holes H of 120 $\mu$m in diameter is placed on an elastic flat surface Ua of a soft rubber sheet U. In this instance, one surface (i.e., first main surface) Ga of the green sheet G which is to constitute an upper surface (i.e., the surface for mounting thereon an IC chip) 1a is positioned to serve as a surface (i.e., a lower surface in FIGS. 1A and 1B) for contact with the elastic flat surface Ua of the rubber sheet U. Then, a metal mask M having through holes MH at corresponding positions to the respective via holes H is placed on the other surface (i.e., second main surface) Gb of the green sheet G.

Figure 1B:
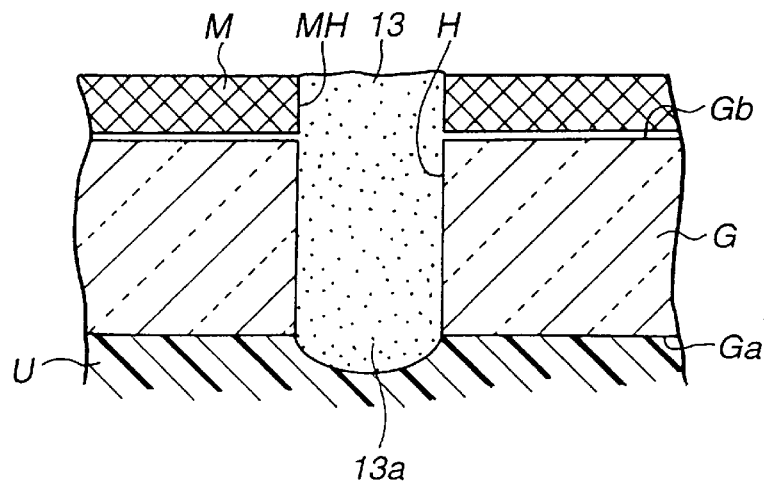
Figure 2A:
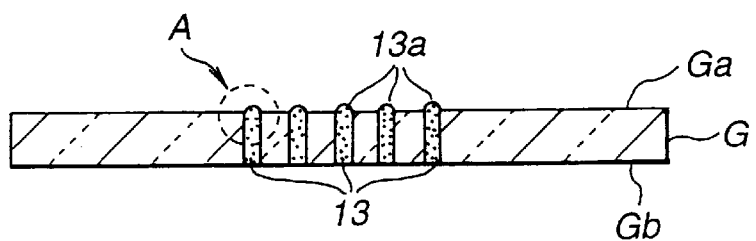
Figure 2B:
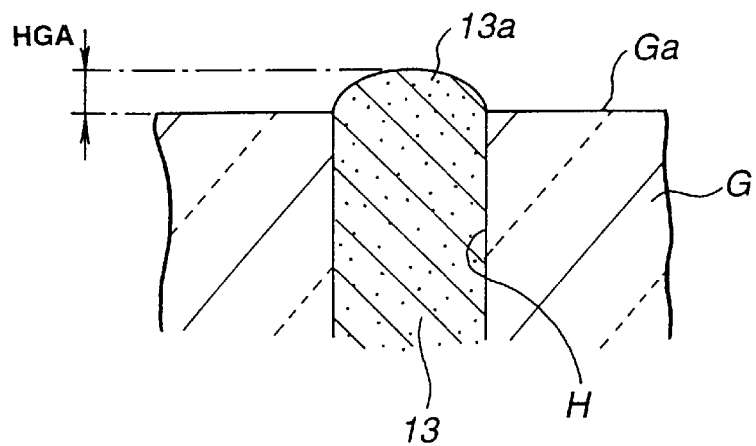

As shown in FIG. 1B, metallizing paste or ink 13 for via under pressure is filled into the through holes H of the green sheet G through the through holes MH of the metal mask M. Suitable pressures for the filling operation in connection with the present invention can range, for example, from about 4.5 to about 7 Kg/cm$^2$ or from 4.5 to 7 Kg/cm$^2$. The ink 13 thus filled into the through holes H protrudes from the through holes H and beyond the first main surface Ga in a way as to push down the rubber sheet U and forms domed protruded portions 13a each of which has a smooth outer surface and is highest (i.e., deepest) at or adjacent the center axis of the through holes H as shown in FIGS. 2a and 2B. The height HGA of the protruded portion 13 is 2 $\mu$m. Since the height HGA of the protruded portions 13a is preferably determined so as to be 10 $\mu$m or less (2 $\mu$n in this embodiment), variations of either of the height HGB (refer to FIG. 3C) of protruded portions 3a of vias 3 and the height HGC (refer to FIG. 4) of pads 2, which are formed in such a manner as will be described hereinlater, can be within a small range from 1 to 2 $\mu$m even after added with variations of the protruded portions 13a of metallizing ink, variations of the amount of protrusion due to the difference of the coefficients of sintering contraction and further variations of the thickness of the plated layer. For this reason, the coplanarity of the protruded portions 3a and therefore the coplanarity of the pads 2 can be made smaller, so the property or quality of connection between the pads and the bumps of an IC chip can be improved.

The metallizing ink 13 for via can be prepared by any known manner, and suitably can be prepared by using molybdenum powder as a major component, by controlling the grain size of the molybdenum powder and the amount of additives such as glass component so that the metallizing ink 13 is suited to the amount of sintering contraction of the green sheet G and the amount of sintering contraction of the metallizing ink 13 is a little smaller than that of the green sheet G (specifically, the coefficient of sintering contraction of the ink 13 is advantageously about 17% for the coefficient of sintering contraction of the green sheet G, which is about 17.5%), and further by adding vehicle and solvent to the molybdenum powder and additives and kneading them.

Figure 3A:
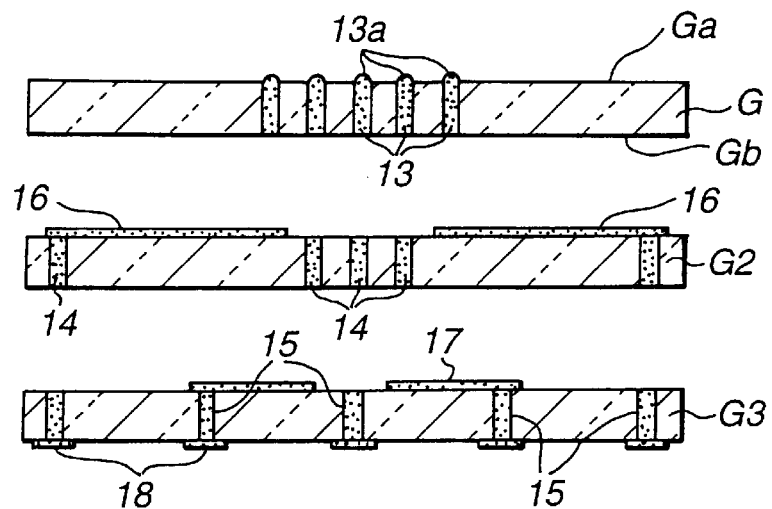
FIGS. 3A to 3C are illustrations of a method of making the substrate according to the first embodiment, wherein FIG.

Thereafter, as shown in FIG. 3A, the green sheet G and other green sheets G2 and G3 which are made of the same material as the green sheet G and have applied thereto and filled therein by a known technique, metallizing ink 16 and 17 for wiring which is to serve as internal wiring after sintering and metallizing ink 18 for pad which is to serve as bonding pad after sintering are laminated (laminate of three layers in this embodiment) and sintered at about 1550 □ in a reducing atmosphere. In the meantimne, the same metallizing ink as the metallizing ink 13 for via filled into the green sheet G was used for the metallizing ink 14 and 15 for via, and the ink including molybdenum as a major component was also used for the metallizing ink 16 and 17 for wiring. Further, the green sheets are laminated in such a manner that the first main surface Ga of the green sheet G is located on the outermost side.

Figure 3B:
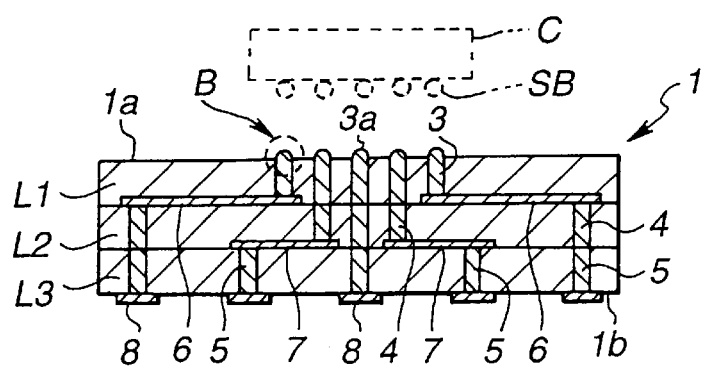

By this, as shown in FIG. 3B, it is prepared the incomplete (i.e., not yet plated) substrate 1 which consists of three ceramic layers L1, L2 and L3 made of alumina ceramic, vias (i.e., conductive passages) 3 containing molybdenum as a major component and having protruded portions 3a protruding beyond the upper surface (mounting surface), and further having internal wiring conductors 6 and 7 and vias 4 and 5 extending through the insulation layers L2 and L3 to provide conduction between the upper and lower sides of the insulation layers L2 and L3. Further, at the rear surface 1b of the incomplete substrate 1 are formed bonding pads 8. The mounting surface 1a, after processed by plating, serves as a surface for mounting thereon an IC chip C having solder bumps SB as shown dotted lines in FIG. 3B.

Figure 3C:
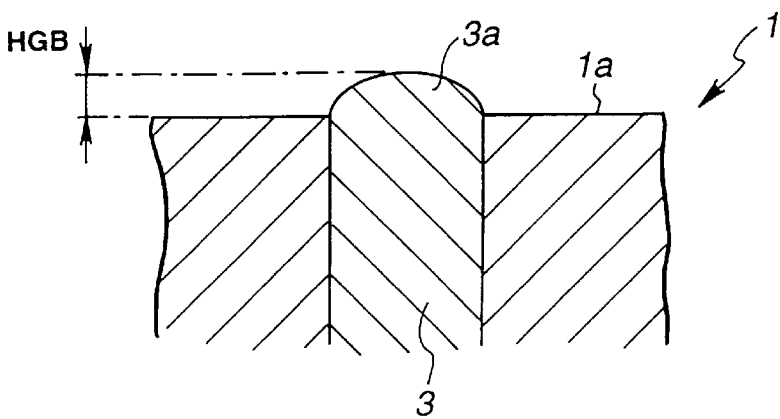

As described above, the protruded portions 13a of the metallizing ink 13 for via are provided previously. Further, the coefficient of sintering contraction of the ink 13 is determined so as to be a little smaller than that of the green sheet G. Due to this, the vias 3, as shown in FIG. 3C, are formed by sintering to have such a figure substantially similar to that of the metallizing ink 13 for via before sintering, so that since the protruded portion 13a of the metallizing ink 13 before sintering has a domed shape, the protruded portion 3a of each via 3 has a domed shape.

In the meantime, since the difference of the coefficient of sintering contraction contributed to protrusion of the via 3, the height HGB of the protruded portion 3a became 3 μm higher than the height HGA of the ink protruded portion 13a which was 2 μm, i.e., became 5 μm. Further, since the difference in the coefficient of sintering contraction between the ink 13 and the sheet G was determined small so that the amount of protrusion of the via 3 due to the difference of (HGB−HGA) was 5 μm or less (3 μm in this embodiment), there never occurred such a drawback that radial cracks were caused in the insulation layer L1 around the vias 3.

Further, since the inks 14 and 15 are of the same material as the ink 13 and the sheets G2 and G3 are of the same material and the difference in the coefficient of sintering contraction between them is small though their coefficients of sintering contraction differ a little, cracks or other defects are never caused in the ceramic insulation layers L2 and L3. Accordingly, it is not necessitated to use inks of different coefficients of sintering contraction for the sheet G and for the sheets G2 and G3, respectively and fill them into the through holes thereof but a single kind of ink will suffice, so the manufacturing process is simplified.

Figure 4:
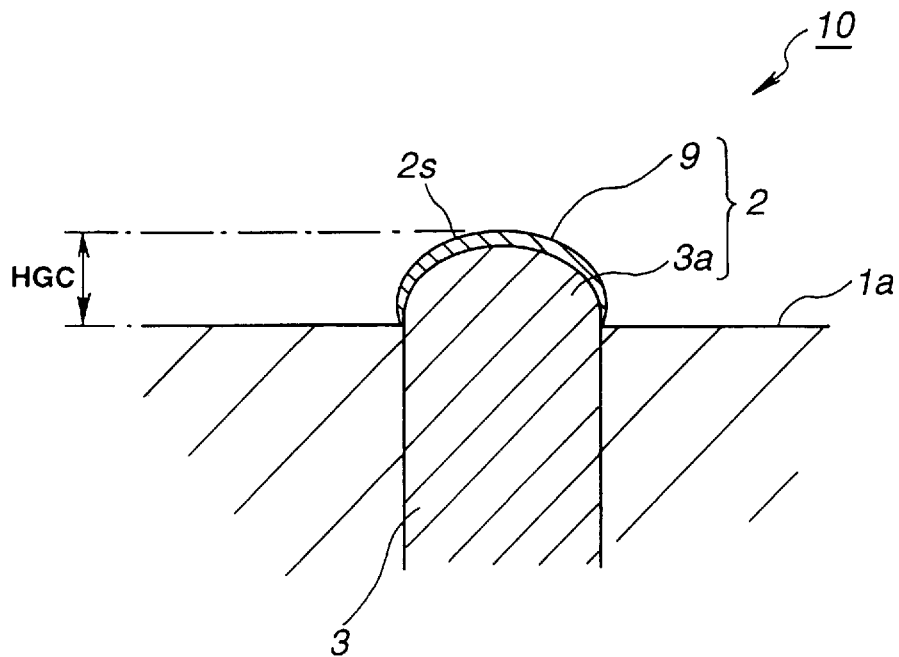
FIG. 4 is an enlarged view of a pad of FIG. 3C, in a condition of being plated.

Thereafter, the incomplete substrate 1 can be treated by an electroless plating technology and provided with an electroless Ni-plating (3.5 μm thick) and a Au-plating (0.05 μm thick) to have a plated layer 9 consisting of two layer sections, whereby to complete, as shown in FIG. 4, the substrate 10 having pads 2 each including the protruded portion 3a of the via 3 and the plated layer 9. The surface 2s of each pad 2 is preferably higher at its central portion than the surrounding and smooth, i.e., has a domed shape, and the height HGC of the pad 2 was about 8.5 μm. Further, the via 3 is connected to the internal wiring conductor 6 inside the substrate 10, and the internal wiring conductor 6 is in turn connected to another internal wiring conductor 7 and the vias 4 and 5.

While in this embodiment the metallizing ink containing molybdenum as a major component is used to form the via 3, any other known metallizing ink can be used. For example, tungsten may be used in lieu thereof, and further an alloy of tungsten and molybdenum (or mixture thereof) may be used. Further, as the plated layer 4 any suitable material or materials can be used, such as the plated layer can include two layer sections, i.e., Ni-plated layer section and a Au-plated layer section; alternatively only a Ni-plated layer section may be used in lieu thereof or a plated layer of Cu, Ag or the like may be used. Further, if electrical conduction can be attained, the plated layer may be formed by an electroplating technology. Further, the electroplating may be made by barrel plating.

Figure 5:
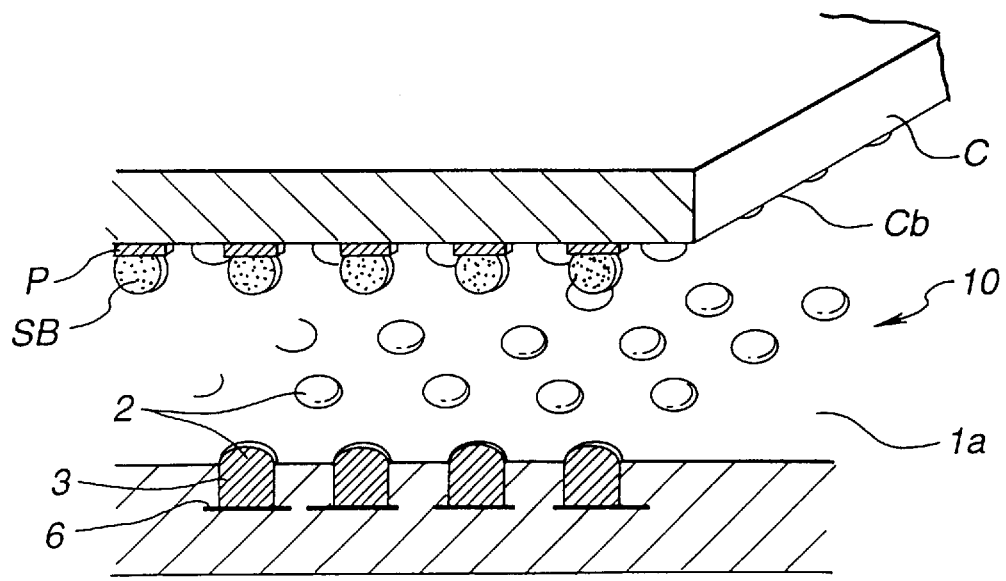
FIG. 5 is a perspective, partly sectional view of a substrate produced according to a method of the first embodiment, for illustrating how an integrated circuit chip can be mounted on the substrate.

FIG. 5 shows how an IC chip can be mounted on the substrate 10. At the lower surface Cb of the IC chip C are formed a number of IC-side pads P which can be arranged in a grid pattern including vertical and horizontal arrays, and each IC-side pad P has formed thereon a solder burp SB having a nearly spherical shape (i.e., about ¾, or ¾ or even a greater percentage of a sphere). The solder bump SB is formed of high temperature solder of 3Sn-97Pb. The pads 2 are formed at corresponding positions to the respective IC-side pads P of the IC chip C and arranged in a grid pattern including vertical and horizontal arrays.

Figure 6A:
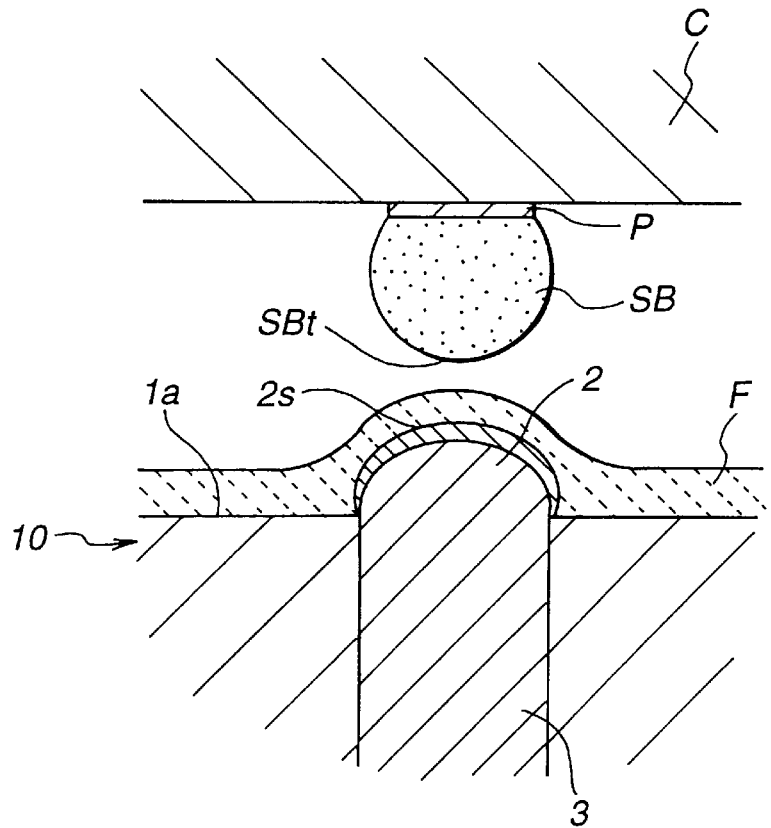
FIGS. 6A and 6B are illustrations of how a solder bump contacts a pad in the process of connecting an integrated circuit chip to a substrate.

The IC chip C and the substrate 10 can be connected in the following manner (i.e., by a flip-chip technology). That is, to the mounting surface 1a of the substrate 10 and the pads 2 formed thereon is applied solder flux F as shown in FIG. 6A. The substrate 10 is held opposite to the chip C and positioned so that the solder bumps SB and the pads 2 correspond in position to each other, i.e., are aligned with each other. Thereafter, the IC chip C is mounted on the substrate 10 in a way as to bring the solder bumps SB into contact with the pads 2, respectively.

Figure 6B:
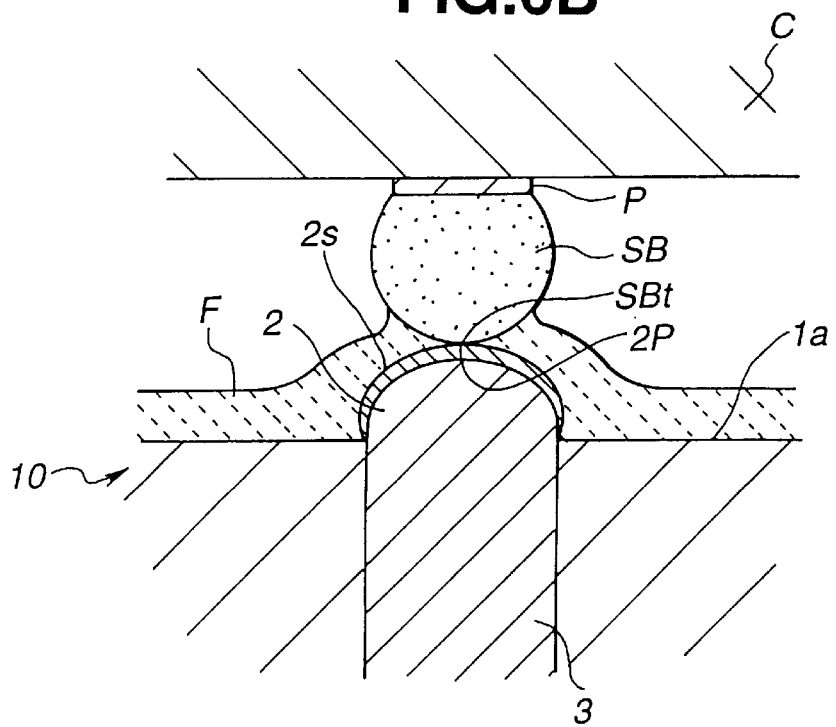

In this instance, the chip C, as shown in FIG. 6B, is held fixed by the adhesion of the flux F, and the top or apex portion SBt of the solder burp SB contacts at its quite small area with the pad 2, i.e., since the surface 2s of the pad 2 is formed into a domed shape, the solder bump SB contacts substantially at one point (at the contact point 2p) with the surface 2s.

Then, the solder bump SB can be melted such as by infrared ray reflow to connect the chip C and the substrate with each other.

In this instance, the flux F, when heated, becomes lower in viscosity and easy to flow, and when further heated, it removes the oxide coatings of the surface of the solder bump SB and the plated layer 9 of the pad 2 to improve the wettability of the solder and then gasified to be dispersed.

The solder bump SB starts melting preferentially at the top portion SBt in contact with the contact point 2P of the pad 2. The reason why is not clear, but it is believed that the melting point of the solder bump SB is slightly lowered only at or adjacent the top portion SBt due to the fact that only the top portion SBt of the surface of the solder bump SB is subjected to pressure and the surface condition of the solder bump SB varies at the top portion under the influence of the pad in contact with the top portion SBt.

Figure 7A:
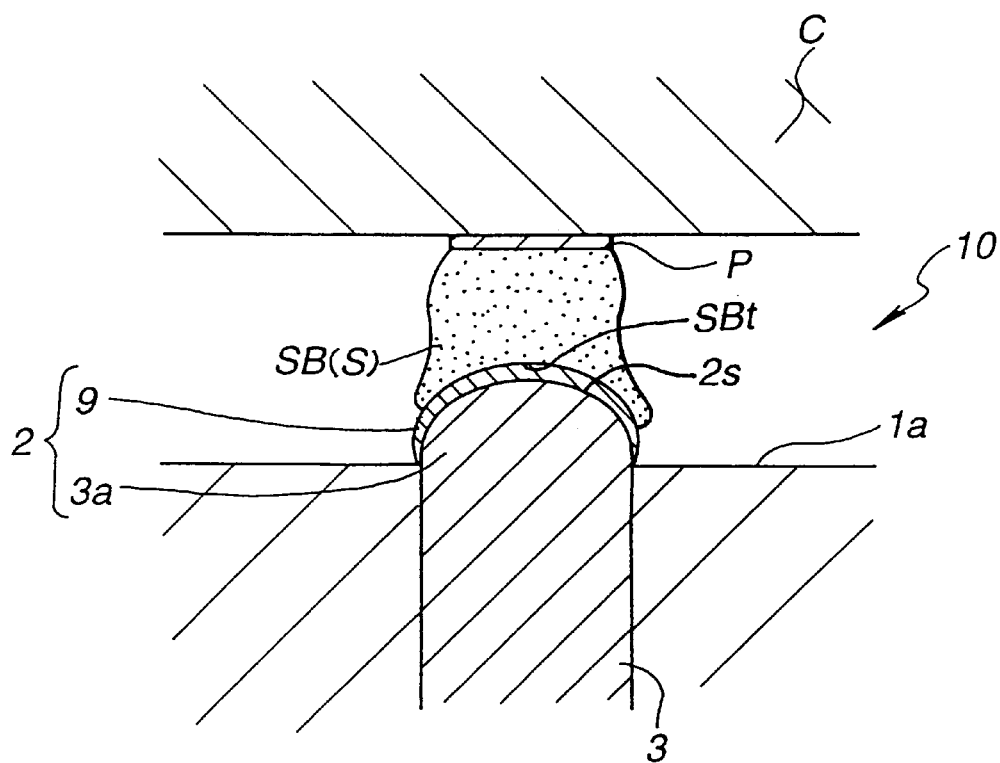
FIGS. 7A and 7B are illustrations of how a solder bump can be connected to the pad in a process for connecting an IC chip to a substrate.

Accordingly, as shown for example, in FIG. 7A, the solder ball SB which starts melting preferentially at the top portion SBt wets and spreads over the surface 2s of the pad 2 and around the contact point 2p (refer to FIG. 6B). In this instance, the solder S of the solder ball SB wets and spreads while excluding air and the flux F from the surface 2s of the pad 2, so there never occurs such a case wherein air and cracked gas of the flux F are involved in the solder S.

Figure 7B:
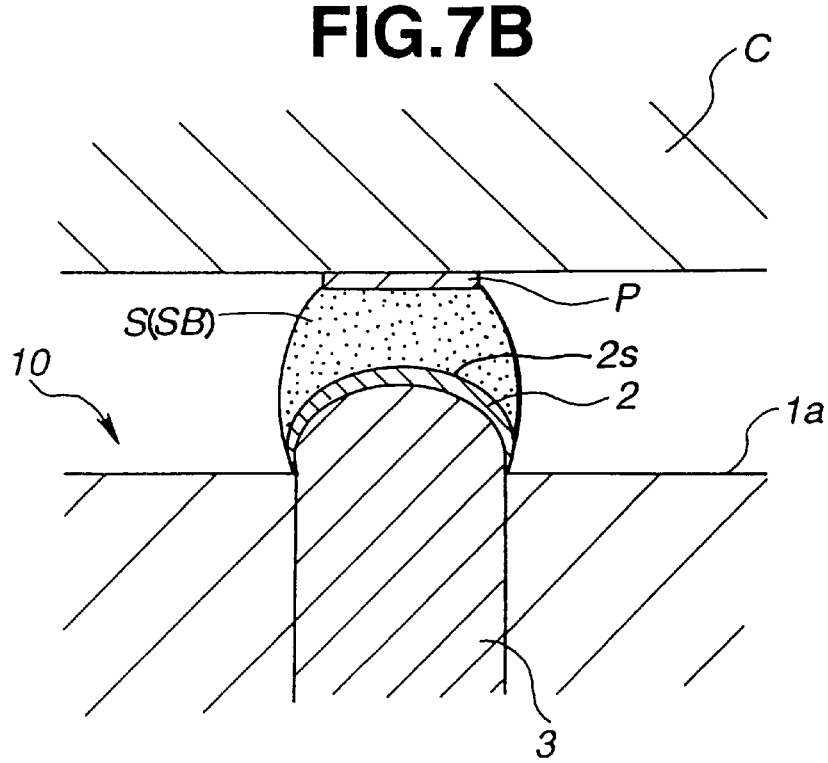

In this manner, as shown for example in FIG. 7B, by connecting the chip-side pad P and the pad 2 by means of the solder S, the chip C and the substrate 10 are connected.

Since the solder S wets and spreads over the pad surface 2s without involving air and the flux F therewithin, there never occurs such a case wherein voids are formed inside the solder S by air and cracked gas of the flux F.

Below, a comparative example of substrate which is subjected to a tensile breaking test which will be described later, together with the substrate according to the above described first embodiment, will be described.

FIRST COMPARATIVE EXAMPLE

Figure 8A:
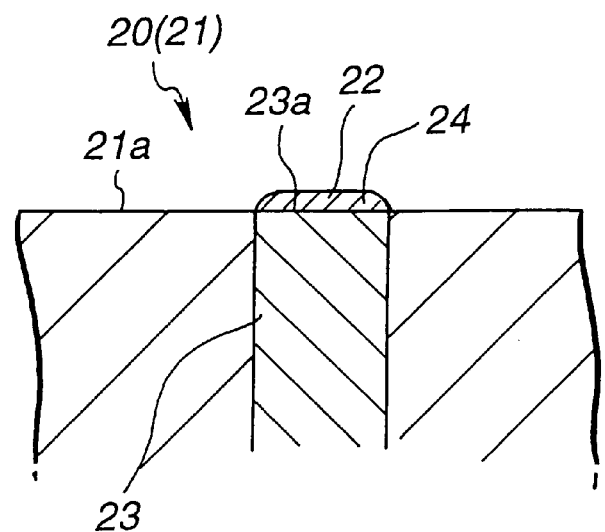
FIGS. 8A and 8B are fragmentary sectional views of the first and second comparative examples of substrate.

A first comparative example of substrate 20, as shown in FIG. 8A,.is substantially similar to the substrate 10 of the first embodiment except for the upper surface portion of the pad 22 is flat or planar. Further, the substrate 20 is made of the same material as the substrate 10 of the first embodiment. That is, an incomplete (i.e., not yet plated) substrate 21 made of ceramic containing alumina as a major component is formed with vias 23 made of a material containing molybdenum as a major component. The upper surface 23a of each via 23 is flush with the substrate upper surface (i.e., mounting surface) 21a. Further, on the surface 23a is formed a plated layer 24 by Ni-plating and Au-plating such that the upper surface 23a and the plated layer 24 constitute a pad 22.

The incomplete substrate 21 is prepared substantially similarly to the incomplete substrate 1 of the first embodiment except that at the time of forced filling of metallizing ink a plurality of green sheets are laminated for filling of metallizing ink for via under pressure and thereafter the green sheets are separated from each other to carry out further filling of the ink in the through holes, so there is not formed any protruded portion of ink.

Due to this, the via 23 is not formed with a protruded portion but has an end surface flush with the substrate upper surface 21a. Since the via 23 is so shaped, the upper surface of the pad 22 having deposited thereto a plated layer which is substantially constant in thickness is flat or planar.

SECOND COMPARATIVE EXAMPLE

Figure 8B:
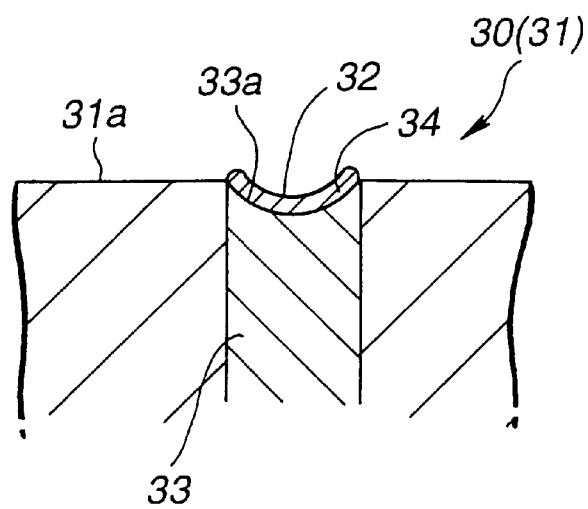

A second comparative example of substrate 30, as shown in FIG. 8B, has pads 32 each having an upper surface which is depressed nearly at a central portion thereof. Further, the upper surface 33a of the via 33 is lower in position than the upper surface (i.e., mounting surface) 31a of the incomplete substrate 31, and the upper surface 33a and the plated layer 34 formed thereon constitute the pad 32.

The incomplete substrate 31 is formed similarly to the incomplete substrate 1 of the first embodiment but differs from the substrate 1 in that the amount of solvent of the metallizing ink for via is a little larger and the amount of sintering contraction of the ink is determined to be larger. Due to this, after a short time after the metallizing ink for via is filled into the through hole H, the solvent volatilizes while allowing the ink to contract relatively largely as it dries, thus causing the upper portion of the ink to be depressed. Further, when the ink is sintered, it contracts more largely than the surrounding (alumina ceramic), thus causing the upper surface 33a of the resulting via 33 to withdraw inward of the through hole H and allowing the upper surface 33a to be depressed at the central portion thereof. Since the via 33 is so shaped, the pad 32 which is constituted by the upper surface 33a and the plated layer 34 deposited on the upper surface 33a and substantially constant in thickness is depressed at the central portion of the upper surface 32a.

THIRD COMPARATIVE EXAMPLE

Figure 13A:
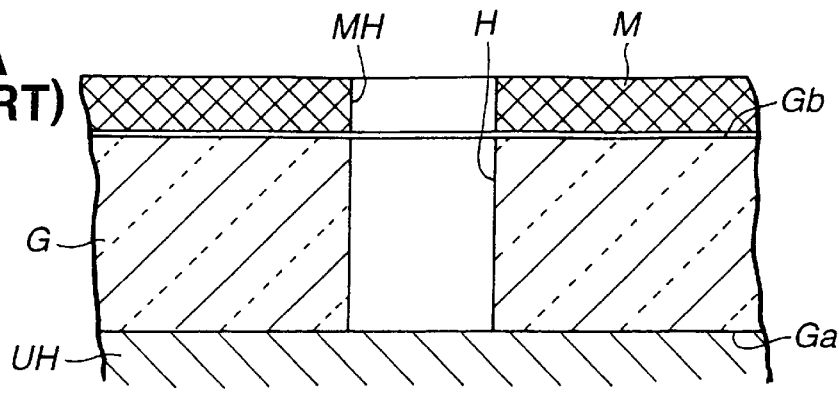
Figure 13B:
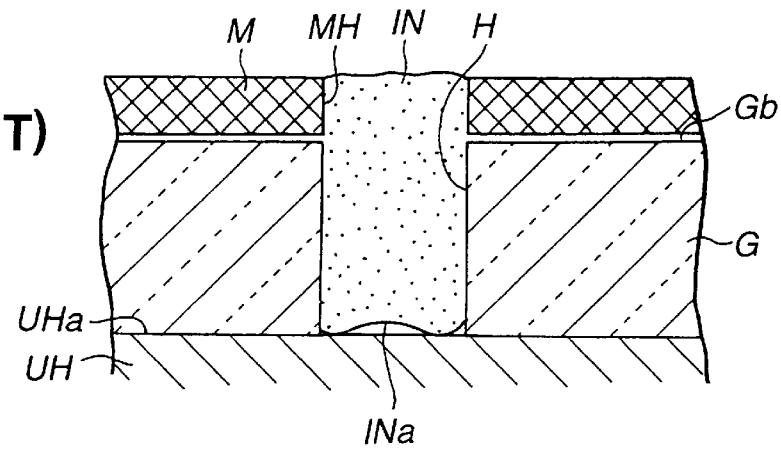
Figure 13C:
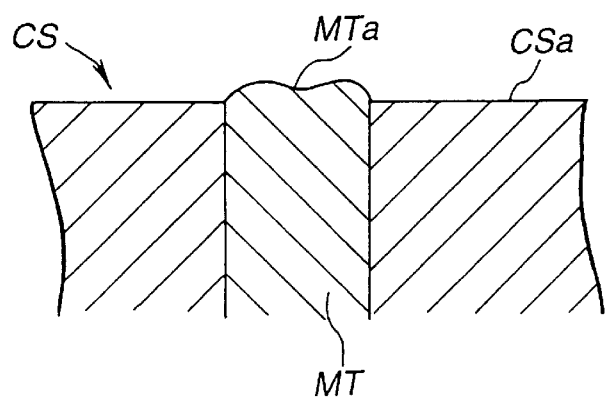

The third comparative example of substrate is made substantially similarly to the first embodiment except that at the time of filling of metallizing ink for via in the green sheets the ink is filled while holding the sheet G on a metal plate UH having a hard flat surface UHa, i.e., filling of ink is carried out by a prior art technique as shown in FIGS. 13A and 13B. In the third comparative example, the end surface INa of each mass of ink IN filled into the through hole H is not always flat or planar as shown in FIG. 13B, so it was used in the test such a substrate 40 that was obtained by plating the incomplete substrate CS having vias MT part of which had such irregularities at the end MTa as shown in FIG. 13C.

Tensile Breaking Test

A test for the quality or property of connection of the chip C to the above described first embodiment and the respective first to third comparative examples was made in the following manner.

Figure 9A:
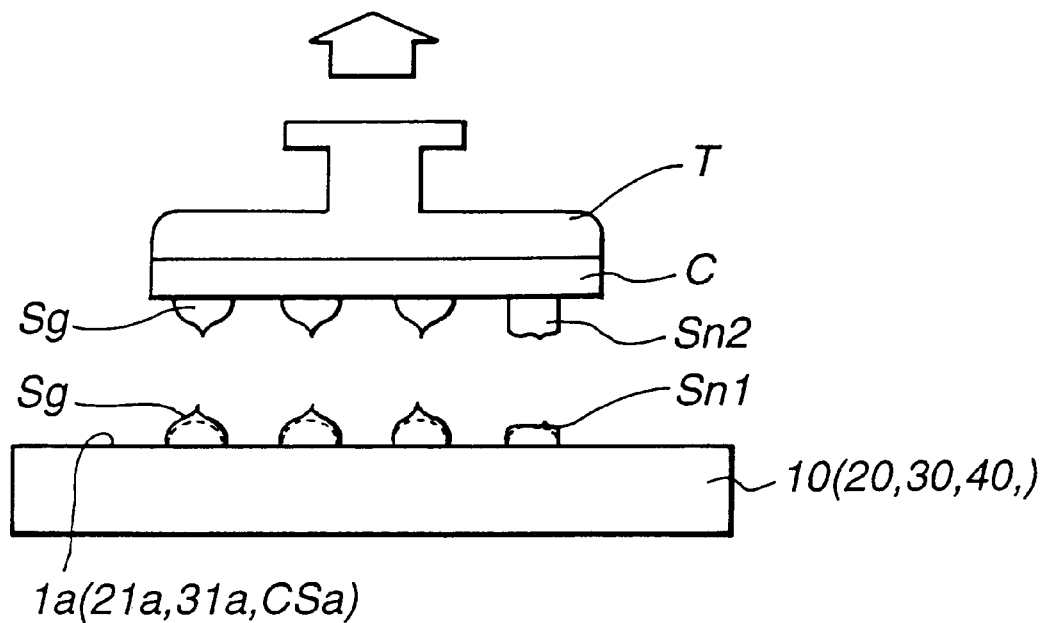
FIG. 9A is an illustration of a tensile breaking test.

The tensile breaking test for the comparison was carried out by fixedly holding the substrate 10, 20, 30 or 40 as shown in FIG. 9A, mounting and connecting an IC chip C to the mounting surface 1a, 21a, 31a or Csa by way of solder S and pulling the IC chip C upward. Specifically, a pulling jig T is fixed to the chip C by adhesive (not shown) and the jig T is pulled upward.

Figures 9B, 9C:
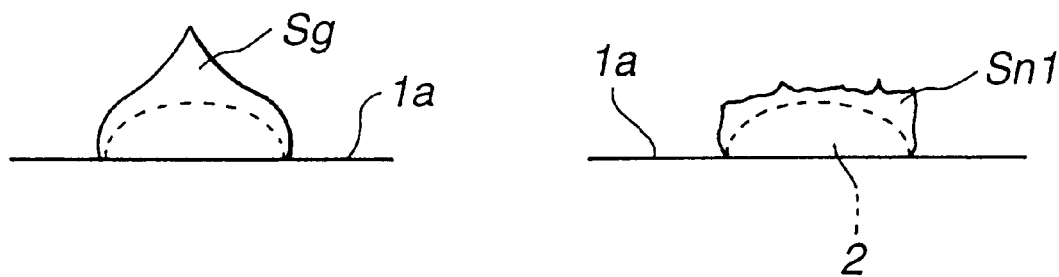
FIGS. 9B and 9C are illustrations of how solder remains on the pad after the test.

By this, in case there is not any void in the solder and therefore the connection is good, the solder S which is a soft metal is pulled vertically and is stretched thin at the central portion thereof and finally broken or fractured. When observing the shape of fracture, the solder whose breakage or fracture is normal takes a nearly conical shape as shown in FIG. 9B. The reason why such breakage occurs is that since there is not any void inside the solder the solder is stretched to become thin sufficiently without being broken in the course of stretching.

On the other hand, in case the connection is defective, the solder S is broken adjacent the upper surface of the pad 2 which is indicated by dotted line, as shown by the rightmost one of the solders in FIG. 9A, and most of the solder Sn2 retains on the chip C side whereas only a small amount of solder Sn1 remains on the substrate 10 side. Further, it is observed that fine irregularities exist on the fracture surface as shown in FIG. 9C. The irregularities are considered as traces or marks of voids. From this, it is considered that a partial existence of a number of voids in the solder S occurs adjacent the pad 2 so at the portion of the solder where the partial existence of voids occurs the actual cross sectional area of the solder S is small and therefore the solder is broken or fractured before it is stretched to become thin.

Thus, the tensile breaking test was conducted with respect to the above described first embodiment 10 and the above described comparative examples 20, 30 and 40 to which the IC chips were connected, respectively. The number of the connecting points at which a substrate and an IC chip were connected was 680 points per one set of the substrate and IC chip. The tensile breaking test was conducted twice with respect to the five sets of the substrates and IC chips (i.e., the total number of connecting point was 6800), i.e., the test was conducted with respect to ten sets and the number of the connecting points whose fracture were such as shown in FIG. 9C was represented by percentage. The result was shown in Table 1.

TABLE 1

| Test | 1st Embodiment (Domed Shape) | 1st Comparative Example (Flat Plate Shape) | 2nd Comparative Example (Depressed Shape) | 3rd Comparative Example (Metal Flat Plate) |
| --- | --- | --- | --- | --- |
| First Time | 0% | 6% | 11% | 8% |
| Second Time | 0% | 7% | 19% | 5% |

As will be apparent from Table 1, in case of the first and second comparative examples wherein the surface of the pads was flat or depressed, some connections caused such fracture as shown in FIG. 9C, whereas there was not caused any defective in the first embodiment. Further, in the third comparative example wherein the pads had irregular surfaces, some connections caused such fracture shown in FIG. 9C.

In this connection, it is considered that in case the pad was in the form of a flat plate (first comparative example) a relatively large contact area at the joint between the pad 22 and the solder ball SB was attained by the effect of the small irregularities of the surface of the pad 22 and deformation of the solder bump SB and therefore there existed a number of contact points or places where the pad 22 and the solder ball SB contacted with each other. For this reason, it was supposed that the solder that started melting at the number of such contact points nearly at the same time enclosed therewithin adjacent air and flux such that voids was caused by the air and the cracked gas of the flux and involved in the solder ball SB.

This was considered more probable from the fact that the example wherein the contact area between the solder bump SB and the pad 32 was large (second comparative example) caused an increased number of defective connections.

Further, it is considered that the reason why defective connections were caused also in the third comparative example is that a number of contact points existed between the pad and the solder bump SB due to the surface irregularities.

In contrast to this, in the first embodiment, the pad 2 is domed so that the contact area where the pad is in contact with the solder bump SB becomes smaller and is first brought into contact with the solder ball SB substantially at one point to allow the solder ball SB to wet and spread while expelling air and flux from the interface between the solder S and the pad 2, resulting in that there was not any amount of or there was only a quite small amount of air and gas of flux involved.

Further, since the pad 2 is domed, movement of the IC chip from its correct position to some extend allows the solder bump SB and the pad 2 to contact at one point at any time, thus not causing any voids in the solder bump SB. For this reason, it becomes possible to prevent a drawback caused by voids stably at any time.

This is supported by the fact that in the second comparative example wherein the contact area is liable to vary depending upon the positional relationship between the IC chip C and the pad 32 the percent defective varied largely between the first and second tests and in contrast to this there was not caused any defective in either of the tests in the embodiment of this invention.

In this manner, by the embodiment of this invention, it becomes possible to form the via 3 having the protruded portion 3a and the pad 2 assuredly and therefore it becomes possible to attain substrate with a pad having a high reliability in connection with an IC chip. Furthermore, since it will suffice for attaining such a via 3 with a domed protruded portion 3a to carry out filling of ink 13 by using the rubber sheet U, thus not causing any increase in the number of manufacturing process and making it possible to manufacture the incomplete substrate 1 and the plated substrate 10 at low cost.

SECOND EMBODIMENT

Figure 10A:
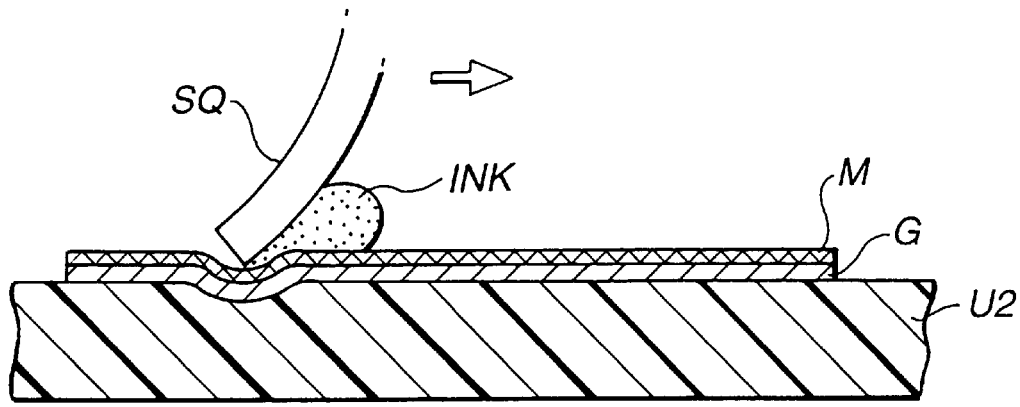
Figure 10B:
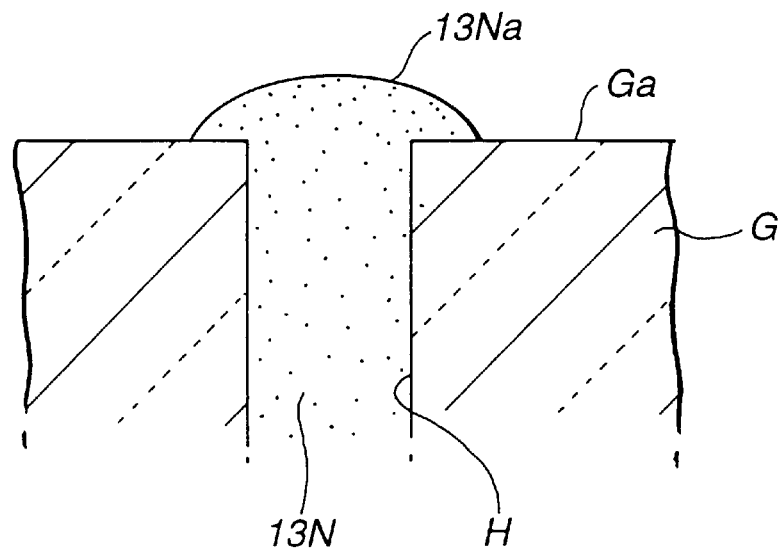

In the above described first embodiment, the green sheet G was placed on the flat rubber sheet U. The mask M was then placed on the green sheet G and thereafter filling of ink was carried out. However, in case such a rubber sheet U2 that is low in hardness (soft) and thick is used it becomes depressed excessively when subjected to a pushing force, so that there may possibly occur such a case wherein the rubber sheet U2 and the green sheet G are warped or bent largely by the pushing force of a squeegee SQ as shown in FIG. 10A to cause wrinkles or the mask M is deformed largely. Further, as shown in FIG. 10B, there may occur such a case wherein the protruded portion 13Na of the filled ink 13N is spread in the direction along the first main surface Ga and thus becomes larger in diameter, whereby the insulation resistance between the adjacent vias is lowered and in the worst case a short circuit is caused therebetween.

Figure 11A:
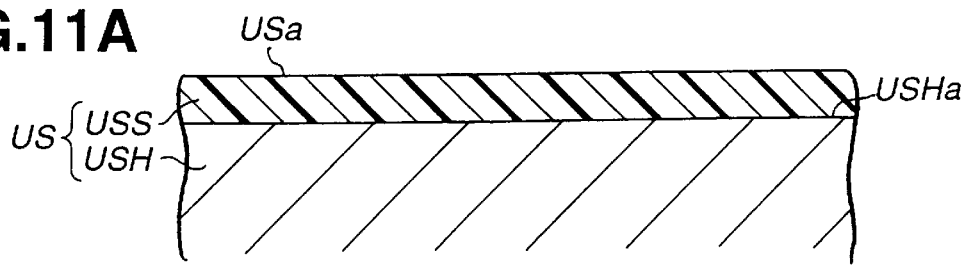

In contrast to this, in this embodiment is used a sheet mounting jig Us as shown in FIG. 11A is used, i.e., the jig US consisting of a base USH made of stainless steel and having a sheet mounting surface (i.e., upper surface in FIG. 1A) USHa which is hard and flat and a rubber layer USS which is soft and 20 μm thick and which is formed by applying rubber latex to the sheet mounting surface USHa and drying it. Any suitable material can be used as the hard base material (such as stainless steel) and any suitable material can be used as the elastic rubber layer (such as rubber latex). In the meantime, in the case the jig US is used, the elastic rubber surface USa shows a rubber elasticity by the effect of the elasticity of the rubber layer USS but the deformation (i.e., depression) of the rubber layer USS caused by the pushing force is limited since the rubber layer USS is thin and the base USH is not deformed by the pushing force. This embodiment differs from the above described first embodiment only in that the sheet mounting jig US is used, so description about similar parts to those of the first embodiment will be omitted or simplified.

Figure 11B:
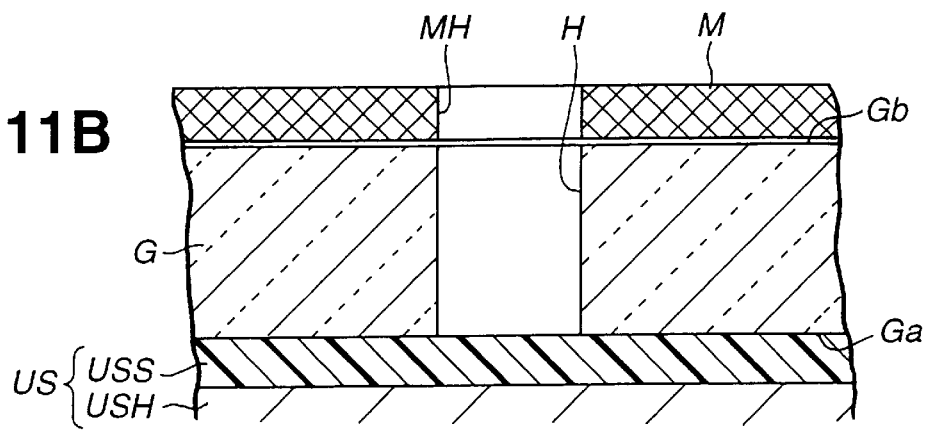
Figure 11C:
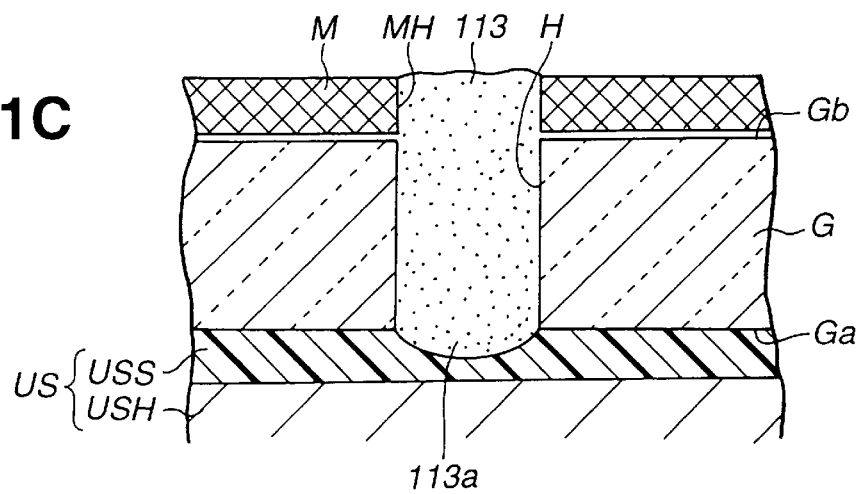

When the green sheet G and the metal mask M are placed on the flat elastic rubber surface USa of the sheet mounting jig US (refer to FIG. 11B) and metallizing ink 113 for via of the same material as the ink 13 in the first embodiment under pressure is forcedly filled into the through holes H, the deformation of the sheet G under the pushing force by the squeegee is restricted and therefore there never occurs such a case wherein wrinkles are caused in the green sheet G. On the other hand, as shown in FIG. 11C, the ink 113 filled into the through holes H protrudes beyond the first main surface Ga toward the rubber layer USS side by the effect of the elasticity of the rubber layer USS.

Figure 12A:
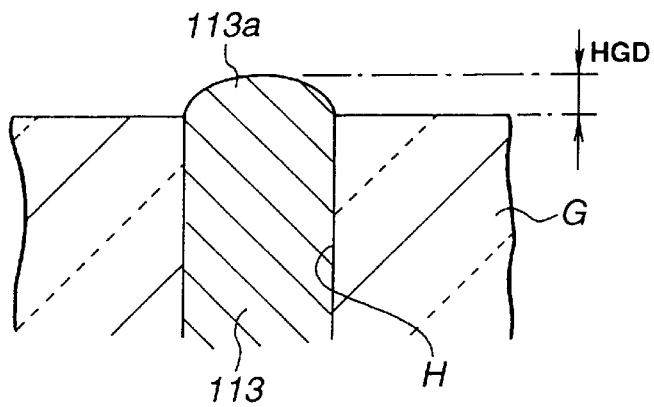

Accordingly, as shown in FIG. 12A, there is attained a domed protruded portion 113a which is smoothly surfaced and is highest at or adjacent the center axis of the through hole H. In this instance, the height of the protruded portion 113a is 4 μm.

Figure 12B:
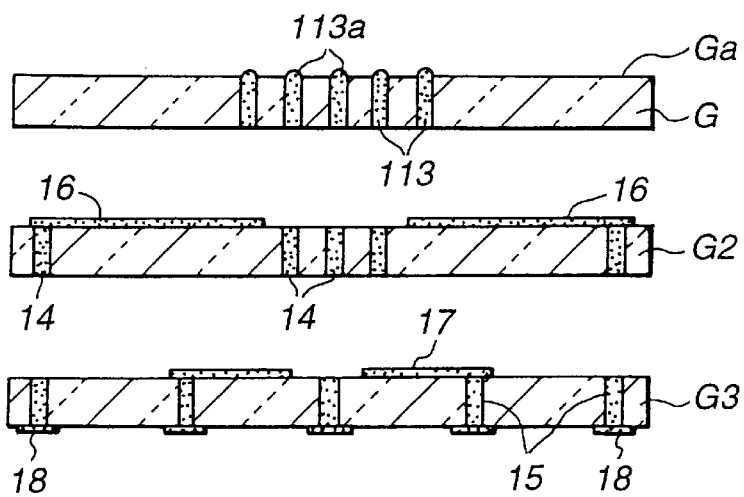
Figure 12C:
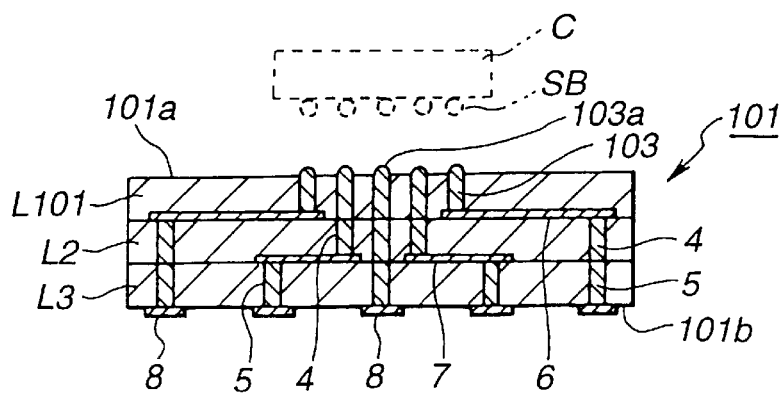

Thereafter, as shown in FIG. 12B, similarly to the above described first embodiment, the green sheet G and other green sheets G2 and G3 which have applied thereto and filled therein metallizing ink 14, 15, 16, 17 and 18 for wiring which is to serve as internal wiring conductors, vias and pads after sintering can be laminated and sintered altogether to form an incomplete (i.e., not yet plated) substrate 101. By this, as shown in FIG. 12C, it is prepared the incomplete substrate 101 consisting of three ceramic layers L101, L2 (however, any number can be used as desired) and L3 made of alumina ceramic, vias 103 containing molybdenum as a major component and having protruded portions 103a protruding beyond the upper surface (i.e., mounting surface) 101a, internal wiring conductors 6 and 7 between the insulation layers, and vias 4 and 5 extending through the insulation layers L2 and L3 to provide conduction between the upper and lower sides of the insulation layers L2 and L3. Further, on the rear surface 101b of the insulation layer L101 are formed bonding pads 8. The mounting surface 101a is a surface for mounting thereon an IC chip C having solder bumps SB as shown by dotted lines after plated as will be described hereinlater. Thereafter, similarly to the first embodiment, the incomplete substrate 101 can be plated, for example, can be Ni-plated and Au-plated to complete a laminate ceramic substrate.

In this embodiment, since the sheet mounting jig US having the rubber layer USS is used for filling the ink 113 in the through hole and forming the protruded portion 113a, the ink 113 can be filled into the green sheet G without causing any wrinkle or the like in the sheet G. Accordingly, it becomes possible to produce a substrate having a high reliability at a higher yield rate.

While the present invention has been described and shown as above, it is not for the purpose of limitation but various modifications and variations can be made within the scope of the appended claims.

For example, while in the above described embodiments the substrate 10 has been described and shown as being in the form of a flat plate, it may have a depressed IC chip mounting surface portion and a surrounding surface portion higher in level than the IC chip mounting surface portion.

Further, while in the above described embodiment the vias 3 made of molybdenum are Ni-plated and Au-plated, the vias may be connected directly with the solder bumps if the material of the vias permits.

The priority documents, Japanese Patent Application No. 10-2662 filed Jan. 8, 1998 and Japanese Patent Application No. 10-343089 filed Dec. 2, 1998 are incorporated herein by reference in their entireties, including their titles, specifications, claims, drawings and abstracts.

What is claimed is:

1. A method of making a ceramic substrate with domed pads, comprising:

preparing a ceramic green sheet having a pair of first and second opposite main surfaces and a plurality of through holes extending between said first and second main surfaces;

placing said ceramic green sheet upon a flat elastic sheet so that said first main surface of said ceramic green sheet is in contact with said flat elastic sheet;

filling metallizing ink into said through holes so that a portion of said metallizing ink protrudes beyond said first main surface to form domed protruded portions by elastic deformation of said elastic sheet; and sintering said green sheet for thereby forming said domed, protruded portions of said metallizing ink into domed pads.

2. A method of making a laminate ceramic substrate with domed pads comprising:

preparing a ceramic green sheet having a pair of first and second opposite main surfaces and a plurality of through holes extending between said first and second main surfaces;

placing said ceramic green sheet upon a flat elastic sheet so that said first main surface of said ceramic green sheet is in contact with said flat elastic sheet;

filling metallizing ink into said through holes and so that a portion of said metallizing ink protrudes beyond said first main surface to form domed protruded portions by elastic deformation of said elastic sheet; and placing said green sheet upon at least one further green sheet so that said second main surface is in contact with said further green sheet and sintering said green sheets, thereby forming said domed, protruded portions of said metallizing ink into domed pads.

3. A method according to claim 2, wherein said filling of said metallizing ink is performed so that the height of said domed protruding portions protruding above said first main surface is in the range from 1 to 10 $\mu$m.

4. A method according to claim 2, wherein the coefficient of sintering contraction of said metallizing ink is smaller than the coefficient of sintering contraction of said ceramic green sheet in contact with said flat elastic sheet.

5. A method according to claim 2, wherein said domed protruded portions of said metallizing ink are formed into pads after said sintering, and the difference in height between each of said protruded portions of said metallizing ink and each of said pads is selected so as to be 5 $\mu$m or less.

6. A method according to claim 2, wherein said further ceramic green sheet is made of the same material as said ceramic green sheet in contact with said flat elastic sheet that form the mounting surface, and said further ceramic green sheet has through holes for vias, and said metallizing ink is also filled into said through holes of said further ceramic green sheet.

7. A method according to claim 2, wherein said flat elastic sheet has a flat elastic surface.

8. A method according to claim 7, wherein said elastic sheet comprises an elastic rubber layer.

9. A method according to claim 8, wherein said elastic sheet further comprises a hard base member having a surface for mounting thereon said ceramic green sheet, said surface of said base member being covered by said elastic rubber layer.

10. A method of making a ceramic substrate with domed, protruded portions of vias protruding from a mounting surface of the substrate, comprising:

placing a ceramic green sheet for forming the mounting surface, which has a first main surface and second main surface and through holes for vias extending between the first and second main surfaces, upon a flat elastic surface which is elastically deformable such that said flat elastic surface becomes depressed at a portion where said elastic surface is pushed;

filling metallizing ink for vias into said through holes from a side of said second main surface of said ceramic green sheet, such that a portion of said metallizing ink protrudes beyond said first main surface by elastic deformation of said flat elastic surface to form domed protruded portions; and sintering said green sheet.

11. A method of making a laminate ceramic substrate with domed, protruded portions of vias protruding from a mounting surface of the substrate, comprising:

placing a ceramic green sheet for forming the mounting surface, which has a first main surface and second main surface and through holes for vias extending between the first and main surfaces, upon a flat elastic surface which is elastically deformable such that said flat elastic surface becomes depressed at a portion where said flat elastic surface is pushed;

filling metallizing ink for vias into said through holes from a side of said second main surface of said ceramic green sheet such that a portion of said metallizing ink protrudes beyond said first main surface by elastic deformation of said flat elastic surface to form domed, protruded portions;

laminating said ceramic green sheet and at least one further ceramic green sheet in such a manner that said first main surface of said green sheet forming the mounting surface is exposed to the outside at least at an area where said domed protruded portions of said metallizing ink are located; and sintering said green sheets.

12. A method according to claim 11, wherein said filling of said metallizing ink is performed so that the height of said domed protruded portions of said metallizing ink above said first main surface is in the range from 1 to 10 $\mu$m.

13. A method according to claim 11, wherein the coefficient of sintering contraction of said metallizing ink is smaller than the coefficient of sintering contraction of said ceramic green sheet for forming the mounting surface.

14. A method according to claim 11, wherein said domed protruded portions of said metallizing ink are formed into pads after said sintering, and the difference in height between each of said domed protruded portions of said metallizing ink and each of said pads is selected so as to be 5 µm or less.

15. A method according to claim 11, wherein said further ceramic green sheet is made of the same material as said ceramic green sheet for forming the mounting surface and said further ceramic green sheet has through holes for vias, and said metallizing ink for vias is also filled into said through holes of said further ceramic green sheet.

16. A method according to claim 11, wherein said flat elastic surface is a surface of an elastic sheet.

17. A method according to claim 16, wherein said elastic sheet comprises an elastic rubber layer.

18. A method according to claim 17, wherein said elastic sheet further comprises a hard base member having a surface for mounting thereon said ceramic green sheet, said surface of said base member being covered by said elastic rubber layer.

* * * * *